United States Patent
Nam et al.

(10) Patent No.: US 7,541,659 B1
(45) Date of Patent: Jun. 2, 2009

(54) PHOTO-DETECTOR FOR DETECTING IMAGE SIGNAL OF INFRARED LASER RADAR AND METHOD OF MANUFACTURING THE SAME

(75) Inventors: Eun Soo Nam, Daejeon (KR); Seon Eui Hong, Daejeon (KR); Myoung Sook Oh, Daejeon (KR); Yong Won Kim, Daejeon (KR); Ho Young Kim, Daejeon (KR); Bo Woo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 126 days.

(21) Appl. No.: 11/635,170

(22) Filed: Dec. 7, 2006

(30) Foreign Application Priority Data

Dec. 12, 2005 (KR) ........................ 10-2005-0121973

(51) Int. Cl.
*H01L 31/06* (2006.01)
(52) U.S. Cl. .................. 257/461; 257/292; 257/458; 257/463; 257/E27.132; 257/E27.133
(58) Field of Classification Search ............. 257/292, 257/458, 461, 463, E27.132, E27.133
See application file for complete search history.

(56) References Cited

U.S. PATENT DOCUMENTS

| 675,321 | A | 5/1901 | Brownfield |
|---|---|---|---|
| 6,051,857 | A * | 4/2000 | Miida .......................... 257/292 |
| 6,753,214 | B1 | 6/2004 | Brinkmann et al. |
| 6,870,207 | B2 | 3/2005 | Taylor |

FOREIGN PATENT DOCUMENTS

| DE | 3629681 | 3/1988 |
|---|---|---|
| DE | 3712864 | 3/1988 |
| DE | 3908886 | 9/1990 |
| EP | 0272372 | 6/1988 |
| EP | 1182705 | 2/2002 |
| EP | 1233458 | 8/2002 |

OTHER PUBLICATIONS

Effenberger, F.J., et al., "Ultrafast InGaAs pin detector for eyesafe LIDAR." Apr. 1998. *SPIE Conference on Laser Radar Technology and Applications III, SPIE* vol. 3380, pp. 144-150.

(Continued)

*Primary Examiner*—Andy Huynh
(74) *Attorney, Agent, or Firm*—Ladas & Parry LLP

(57) ABSTRACT

A photo-detector, in which metal wiring for connecting electrodes is arranged on a planarized surface and thus the metal wiring arrangement is simplified, and a method of manufacturing the same are provided. The photo-detector includes a multi-layer compound semiconductor layer formed on a compound semiconductor substrate. A number of p-n junction diodes are arranged in a regular order in a selected region of the compound semiconductor layer, and an isolation region for individually isolated the p-n junction diodes is formed by implanting impurity ions in the multi-layer compound semiconductor layer. The isolation region and the surface of the compound semiconductor layer are positioned on the same level. The isolation region may be a Fe-impurity region.

12 Claims, 7 Drawing Sheets

OTHER PUBLICATIONS

Kong, S.F., et al., "Electrical Isolation of MQW InGaAsP/InP Structures by MeV Iron Ion Implantation for Vertical Pin Modulators and Photodiodes." May 31-Jun. 4, 2004. *2004 International Conference on Indium Phoshide and Related Materials, Conference Proceedings, 16th IPRM*, pp. 362-365.

Kong, S.F., et al. "Electrical isolation of MQW InGaAsP/InP structures by MeV iron ion implantation for vertical pin modulators and photodiodes." *Indium Phosphide and Related Materials, 2004. 16th IPRM. 2004 International Conference* on Kagoshima, Japan. May 31, 2004. Piscataway, NJ, USA, IEEE. pp. 362-365. XP010814975. ISBN: 0-7803-8595-0.

Database Compendex [Online] Engineering Information, Inc., New York, NY. US; Aug. 8, 1985. Ohnaka Kiyoshi et al: "Planar Ingaas Pin/JFET Fiber-Optic Detector." XP002428044. Database accession No. EIX86030037895.

* cited by examiner

PHOTO-DETECTOR FOR DETECTING IMAGE SIGNAL OF INFRARED LASER RADAR AND METHOD OF MANUFACTURING THE SAME

CROSS-REFERENCE TO RELATED PATENT APPLICATION

This application claims the benefit of Korean Patent Application No. 10-2005-0121973, filed on Dec. 12, 2005, in the Korean Intellectual Property Office, the disclosure of which is incorporated herein in its entirety by reference.

BACKGROUND OF THE INVENTION

1. Field of the Invention

The present invention relates to a photo-detector array for detecting an image signal of an infrared laser radar and a method of manufacturing the same, and more particularly, to a two-dimensional avalanche photo-detector array having a planarized surface, for detecting an image signal of an eye-safe infrared laser, and a method of manufacturing the same.

2. Description of the Related Art

A photo-detector array for detecting an image signal of an eye-safe infrared laser radar having a wavelength band of 1.55 μm includes a number of photo-diodes. The discrete photo-detector includes a semi-insulating InP substrate, a $n^+$-InP layer, an n-InGaAs, n-InGaAsP layer, and n-InP layer layer sequentially stacked on the semi-insulating InP substrate. A photo-absorbing layer is formed in the n-InGaAs layer, and photo-diode amplification region is formed on the n-InP layer where the PN junction is formed. The photo-diodes form unit cells of the photo-detector array, respectively.

The unit cells of the photo-detector must be electrically isolated for the independent electrical access, and a conventional photo-detector uses a trench for this purpose. The trench is a so-called mesa type groove, and is formed by partially etching the n-InGaAs layer and the $n^+$-InP layer.

However, since the unit cells of a conventional photo-detector array are isolated by the trench, metal wiring for connecting p-type electrodes formed on a $p^+$ diffusion region has to be extended over an inner surface of the trench, and thus the path length of the metal wiring becomes long. As a result, signal delay or signal distortion may occur, and the arrangement of the metal wiring may be complicated. Furthermore, since the isolating trench has a deep and narrow shape, the metal wiring in the inner surface of the trench may not be regularly deposited and it may even be disconnected, thereby deteriorating the reproducibility and reliability of a product.

Furthermore, since the trench is used to isolate devices, a side of the p-n junction is exposed outwardly by the trench, thereby causing leakage current.

Accordingly, the photo-detector needs an isolation structure in which the metal wirings between discrete photo diode cells are formed over the electrically isolated flat surface made possible with embedded isolation structure using ion implantation into the semiconductor.

SUMMARY OF THE INVENTION

The present invention provides a photo-detector, in which a metal wiring connecting electrodes of each cells is positioned on a planarized surface, thereby simplifying the metal wiring arrangement.

The present invention also provides a two-dimensional avalanche amplification type photo-detector for detecting an image signal of a laser radar, in which a structure of a connection line between cells is simplified, thereby improving the integration density, speed and noise characteristic of the photo-detector per pixel unit and improving the manufacturing efficiency thereof.

The present invention also provides a method of manufacturing a photo-detector, in which a resultant structure has a planarized surface, thereby shortening the path length of metal wiring.

According to an aspect of the present invention, there is provided a photo-detector comprising: a multi-layer compound semiconductor layer formed on a compound semiconductor substrate; a number of p-n junction diodes arranged in a regular order in a selected region of the multi-layer compound semiconductor layer; and an isolation region formed by implanting impurity ions in the multi-layer compound semiconductor layer, for individually isolating the p-n junction diodes, wherein the isolation region and the surface of the multi-layer compound semiconductor layer are positioned on the same level.

The isolation region may be a Fe-impurity region.

The compound semiconductor substrate may be a semi-insulating InP substrate, and the multi-layer compound semiconductor layer may be a structure in which an $n^+$-InP layer, an i-InGaAs layer, an n-InGaAsP layer, an n-InP layer and a $p^+$-InGaAsP layer are sequentially stacked.

According to another aspect of the present invention, there is provided a method of manufacturing a photo-detector comprising: forming a multi-layer compound semiconductor layer on a compound semiconductor substrate; forming a number of p-n junction diodes in a desired region of the multi-layer compound semiconductor layer; and forming an isolation region by implanting impurities so as to surround each p-n junction diode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In drawings, the shape of components may be exaggerated for clarity. Like numbers refer to like elements throughout the specification.

FIGS. 1A through 1I are cross-sectional views of the respective processes to explain a method of manufacturing an infrared photo-detector according to an embodiment of the present invention; and FIGS. 2A through 2D are plan views of the unit cells of the photo-detector according to an embodiment of the present invention.

Figure 1A:
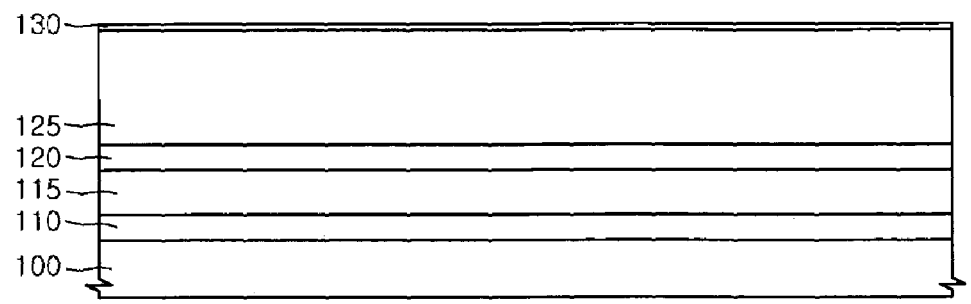
FIGS. 1A through 1I are cross-sectional views of the respective processes to explain a method of manufacturing an infrared photo-detector according to an embodiment of the present invention.

As illustrated in FIG. 1A, on a semi-insulating InP substrate 100, an n$^+$-InP layer 110, an i-InGaAs layer 115, an n-InGaAsP layer 120, an n-InP layer 125, and a p$^+$-InGaAsP layer 130 are sequentially formed. The n$^+$-InP layer 110, i-InGaAs layer 115, n-InGaAsP layer 120, n-InP layer 125, and p$^+$-InGaAsP layer 130 may be sequentially formed and crystallized by a metal organic chemical vapor deposition (MOCVD) process. The i-InGaAs layer 115 may use a material having the proportion of i-In$_{0.53}$Ga$_{0.47}$As, and the n-InGaAsP layer 120 may use a material having the proportion of n$^+$-In$_{0.73}$Ga$_{0.27}$As$_{0.63}$P$_{0.37}$ with a band gap having a 1.3 μm cut-off wavelength. The p$^+$-InGaAsP layer 130 may use a material having the proportion of p$^+$-In$_{0.73}$Ga$_{0.27}$As$_{0.63}$P$_{0.37}$ with a band gap having a 1.3 μm cut-off wavelength which passing the signal light having a 1.5 μm laser radar transmission wavelength. The p$^+$-InGaAsP layer 130 is formed as a thin film on the surface of the n-InP layer 125, and reduces the ohmic resistance between the electrode and the semiconductor.

Figure 1B:
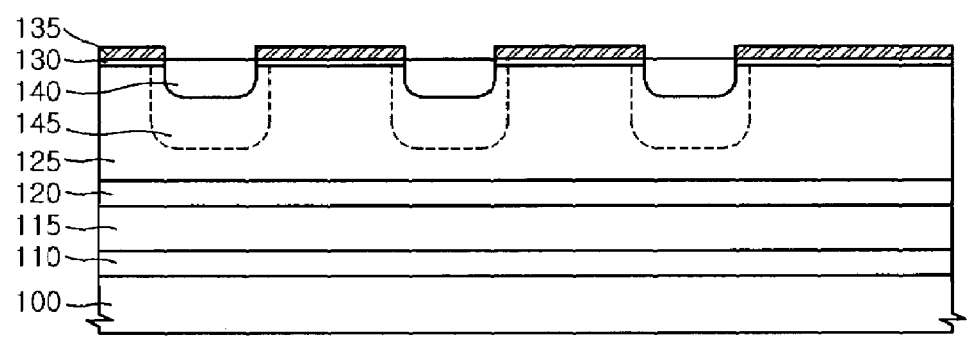

As illustrated in FIG. 1B, an insulating layer pattern 135 is formed on the p$^+$-InGaAsP layer 130 so that a region to be photo-detected is exposed. The insulating layer pattern 135 is formed by a known photolithography process and etching process after an insulating layer is vapor-deposited.

A p$^+$ diffusion region 140 is formed in the selectively exposed p$^+$-InGaAsP layer 130 and n-InP layer 125. The p$^+$ diffusion region 140 may be formed by the following method. For example, a ZnP3 source and a resultant structure (or a crystal specimen) of the substrate are vacuum-sealed in a quartz ampoule. The vacuum-sealed quartz ampoule is electrically heated to 500° C. until Zn is spread on the n-InP layer, thereby forming the p$^+$ diffusion region 140. As the p$^+$ diffusion region 140 is formed, a p-n junction is formed on the n-InP layer 125. The photo-detector has a structure in which the photocurrent is generated by the infrared light absorbed through the i-InGaAs photo-absorbing layer 115 and is avalanche amplified by the p-n junction region. A depletion layer 145 is generated in the p-n junction region, that is, the junction interface between the p$^+$ diffusion region 140 and the n-InP layer 125.

Figure 2A:
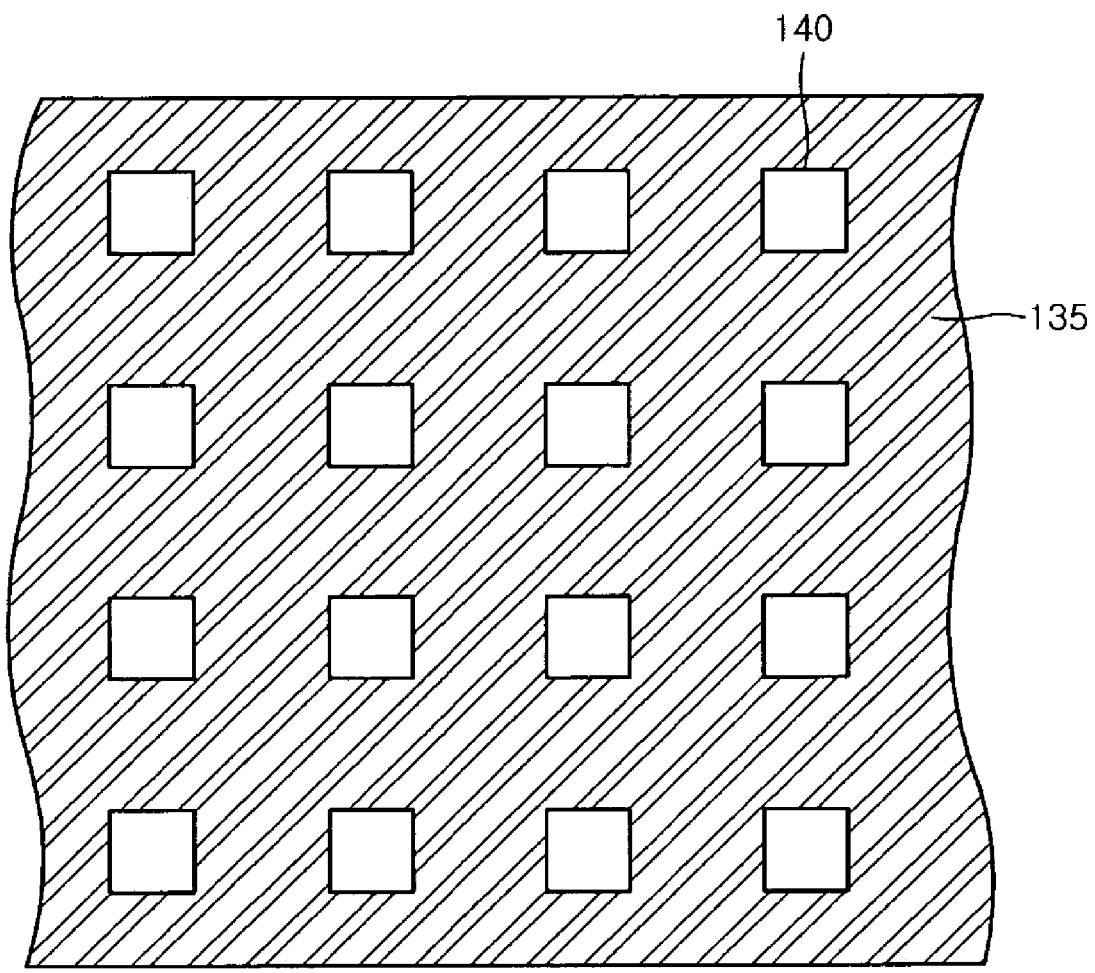
FIGS. 2A through 2D are plan view of unit cells of the photo-detector according to an embodiment of the present invention.

The p$^+$ diffusion region 140 may be arranged in a regular order, for example, a matrix pattern, on the substrate resultant structure, i.e., the insulating layer pattern 135, as shown in FIG. 2A. As the p$^+$ diffusion region 140 is formed, a number of unit cells of the photo-detector are formed.

Figure 1C:
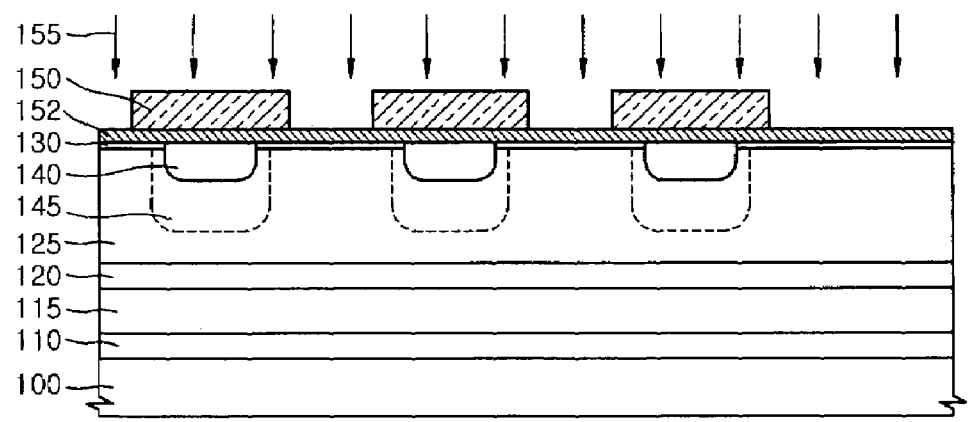

As illustrated in FIG. 1C, the insulating layer pattern 135 is removed by using a known process. A first photoresist pattern 150 is formed on the resultant structure of the substrate 100. A protecting layer 152 may be interposed between the first photoresist pattern 150 and the surface of the resultant structure, i.e., between the first photoresist pattern 150 and the p$^+$-InGaAsP layer 130, thereby protecting the p$^+$-InGaAsP layer 130 and preventing the exfoliation of the first photoresist pattern 150.

Figure 2B:
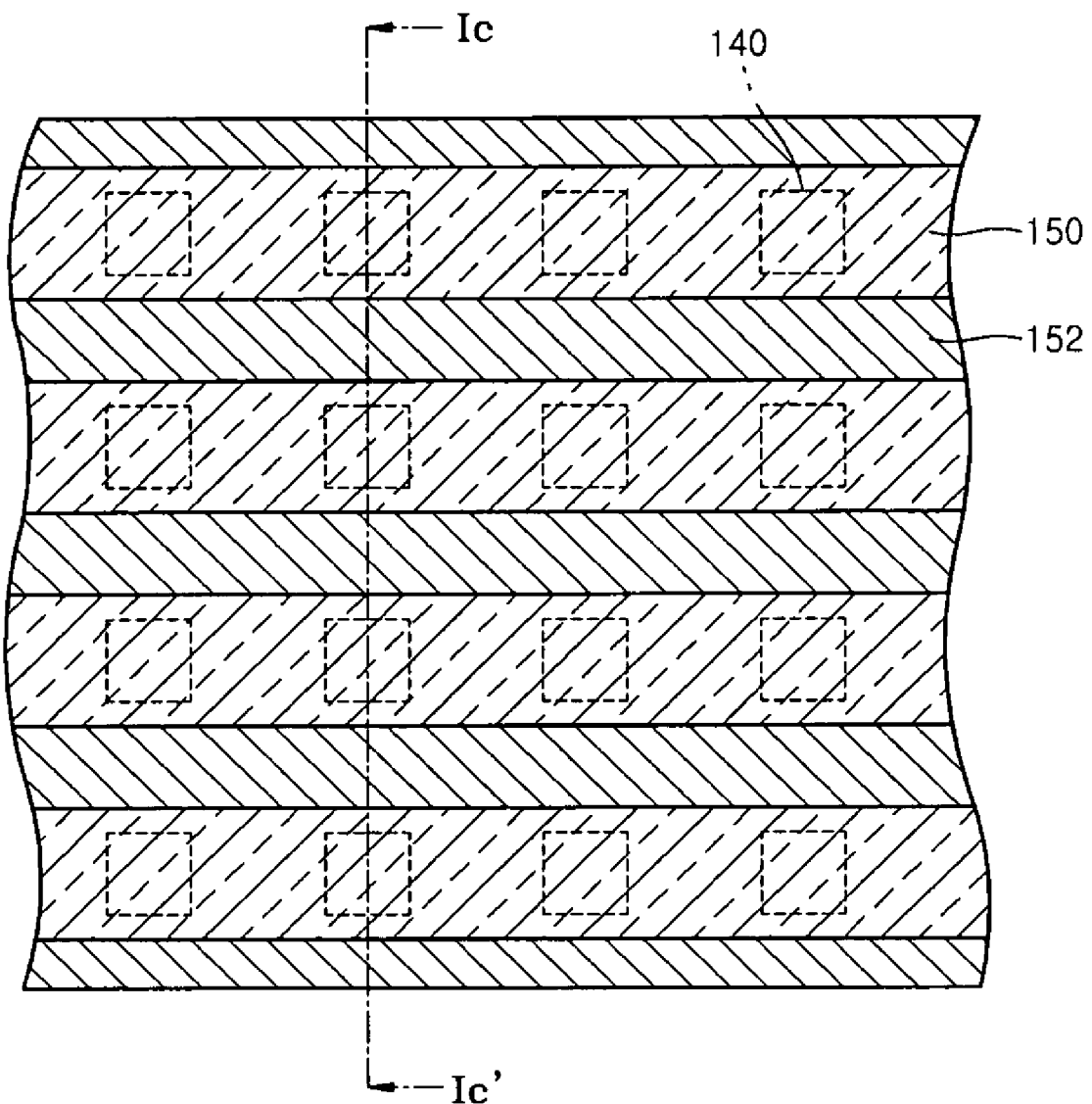

The first photoresist pattern 150 may have a shape of a number of stripes extending in a row direction, as shown in FIG. 2B. The first photoresist pattern 150 is disposed to shield all p$^+$ diffusion regions 140 positioned in the same row. The first photoresist pattern 150 may have a thickness in the range of about 5 to 10 μm, and the critical dimension of the first photoresist pattern 150 may be greater than the width of the p$^+$ diffusion region 140.

In FIG. 1C, isolation ions, for example, Fe-ions, are implanted in the resultant structure of the substrate exposed by the first photoresist pattern 150. The isolation ions may be implanted with a high ion implantation energy so that a final transmission depth of the Fe-ions is positioned in the semi-insulating InP substrate 100.

Figure 1D:
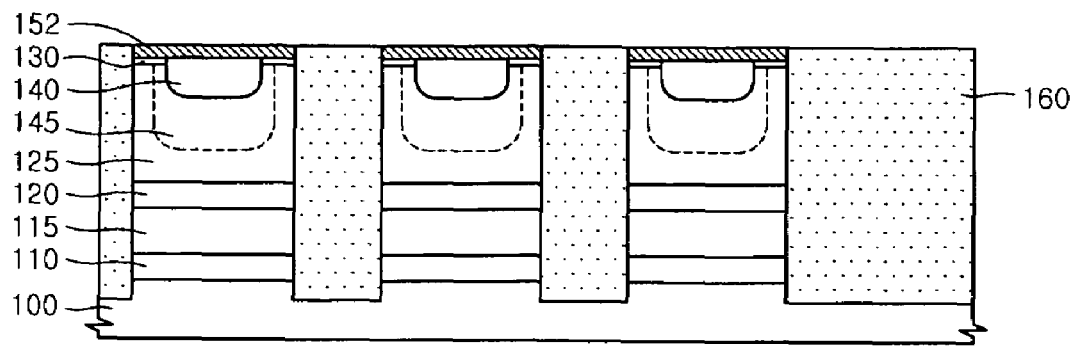

As illustrated in FIG. 1D, the first photoresist pattern 150 is removed by using a known process. A row-directional isolation region 160 is formed, by activating the isolation ions implanted in the resultant structure of the substrate. Since the ion implantation energy is controlled so that the transmission depth of the isolation ions, i.e., Fe-ions, is positioned in the semi-insulating InP substrate 100, the bottom of the row-directional isolation region 160 is positioned in the semi-insulating InP substrate 100.

Figure 1E:
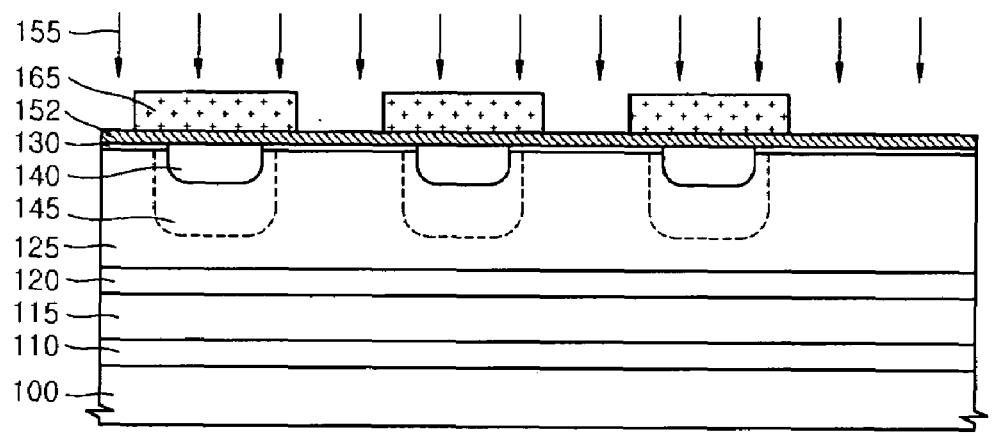
Figure 2C:
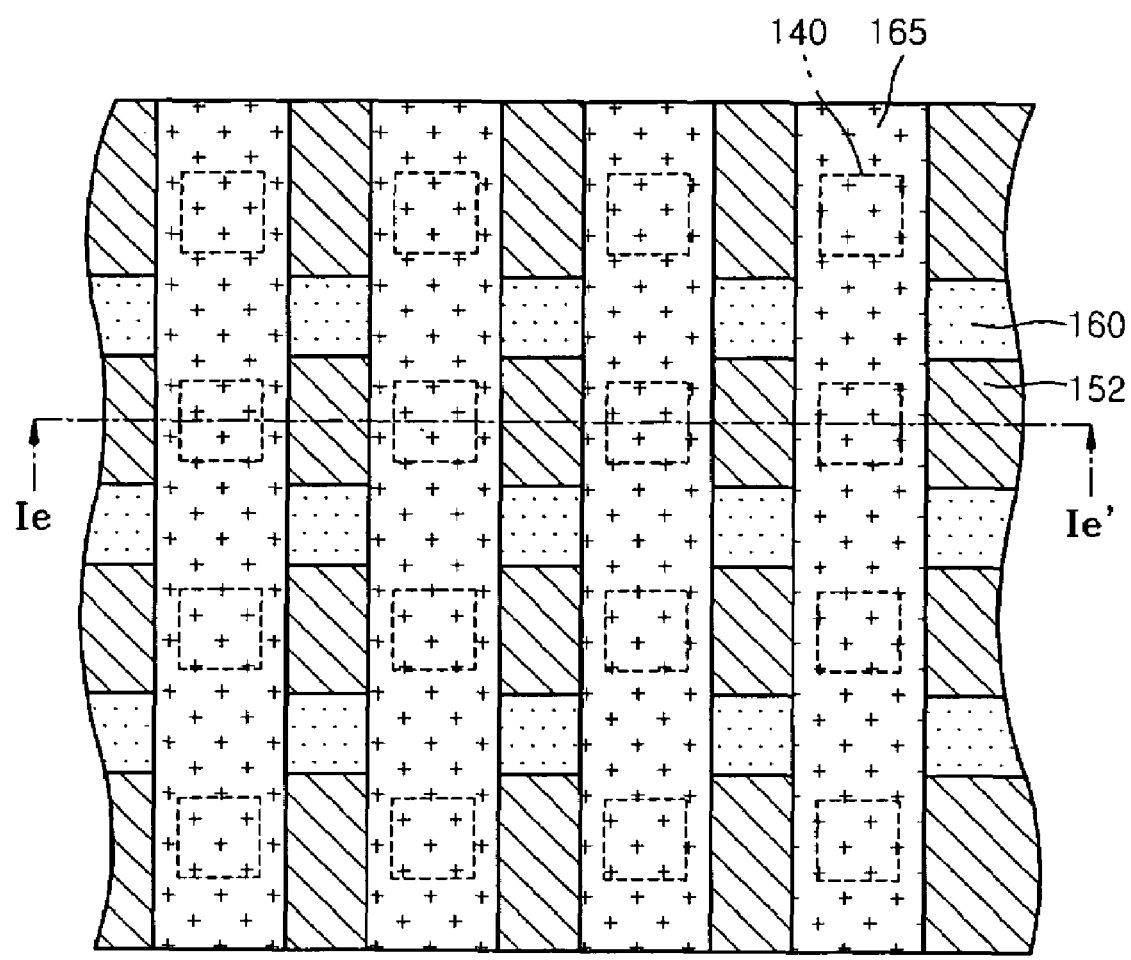

As illustrated in FIGS. 1E and 2C, a second photoresist pattern 165 is formed on the resultant structure of the compound semiconductor substrate on which the row-directional isolation region 160 is formed. The second photoresist pattern 165 has a shape of a number of stripes extending in a column direction, so as to be perpendicular to the first photoresist pattern 150. The second photoresist pattern 165 is disposed to shield all p$^+$ diffusion regions 140 positioned at the same column. Like the first photoresist pattern 150, the second photoresist pattern 165 has a thickness in the range of about 5 to 10 μm, and has a larger width than that of the p$^+$ diffusion region 140. The isolation ions 155, for example, Fe-ions, are again implanted in the resultant structure of the substrate exposed by the second photoresist pattern 165. Unlike the conditions of the row-directional ion implantation, the final transmission depth of the Fe-ions are set to be positioned in the n$^+$-InP layer 110 formed on the semi-insulating InP substrate 100.

Figure 1F:
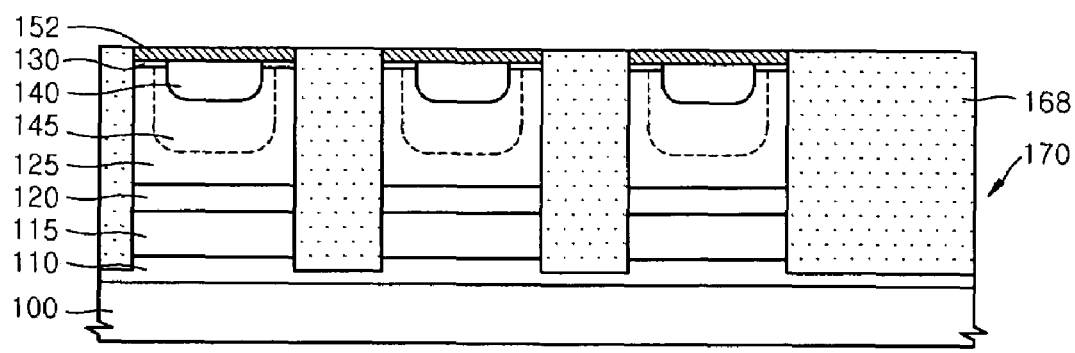
Figure 2D:
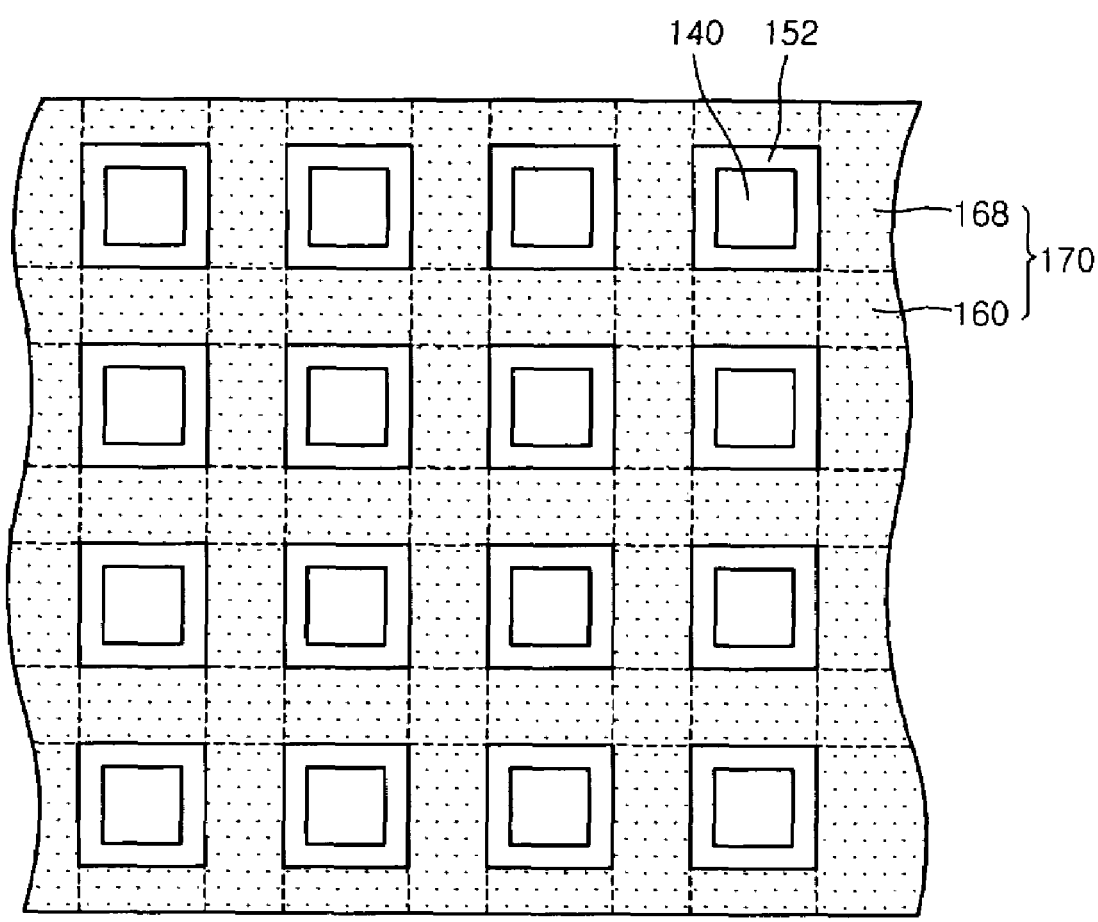

As illustrated in FIGS. 1F and 2D, the second photoresist pattern 165 is removed, by using a known process. A column-directional isolation region 168 is formed, by activating the implanted Fe-ions, thereby forming an isolation region 170. As the isolation region 170 is formed, the p$^+$ diffusion regions 140, i.e., the p-n junction diodes are electrically isolated from other adjacent p-n junction diodes, thereby defining each avalanche type unit cell.

In the present embodiment, after the row-directional ion implantation is completed, the row-directionally implanted Fe-ions are activated. However, the present invention is not limited to this. The row-directionally implanted Fe-ions may not be activated after the row-directional ion implantation is completed. The row-directionally implanted Fe-ions may be activated, together with the column-directionally implanted Fe-ions after the column-directional ion implantation is completed.

Unlike a conventional trench structure, the isolation region 170 according to the present embodiment is formed by deeply implanting the ions, thereby causing no trench structure on the surface of the resultant structure of the substrate 100.

Figure 1G:
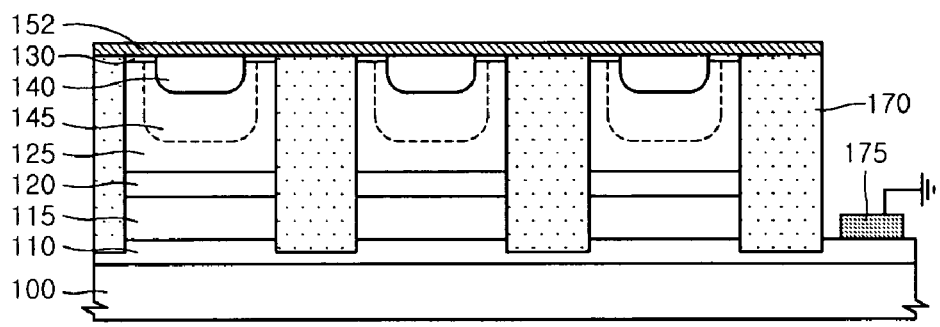

As illustrated in FIG. 1G, the isolation region 170 positioned at an edge of the substrate 100 is anisotropically etched so as to expose part of the n$^+$-InP layer 110 where the Fe-ions are not implanted in the column-direction. The anisotropic etching may use reactive ion etching. An n-type common electrode 175 is formed, by using a known process, on the surface of the n$^+$-InP layer 110 exposed by the anisotropic etching. The n-type common electrode 175 may include, for example, a Ti/Pt/Au laminate.

Figure 1H:
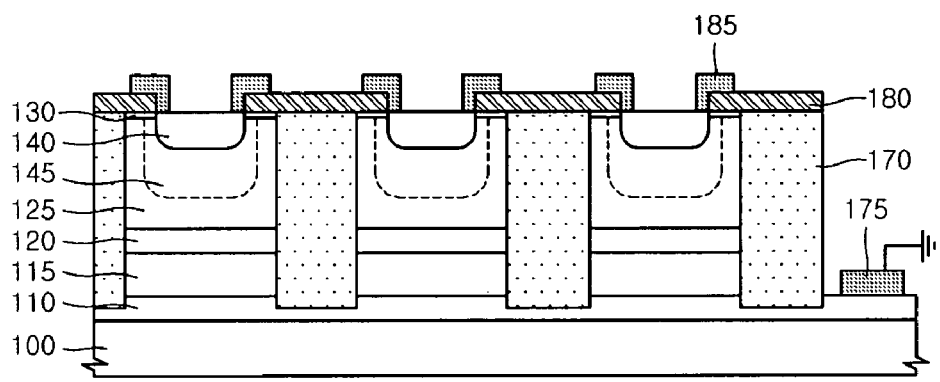

As illustrated in FIG. 1H, an insulating layer 180 is formed on the resultant structure of the substrate 100. The insulating layer 180 may be a silicon nitride layer and may be formed after the protecting layer 152 is removed. A desired portion of the insulating layer 180 is patterned so that the p$^+$-InGaAsP layer 140 is exposed. The insulating layer 180 may be etched so that the whole p$^+$-InGaAsP layer 140 is exposed. P-type electrodes 185 are formed at both edges of the p$^+$-InGaAsP layer 140 and insulating layer 180. The p-type electrodes 185 may use a Ti/Pt/Au laminate and the Ti/Pt/Au laminate may be used by a known lift off method.

Figure 1I:
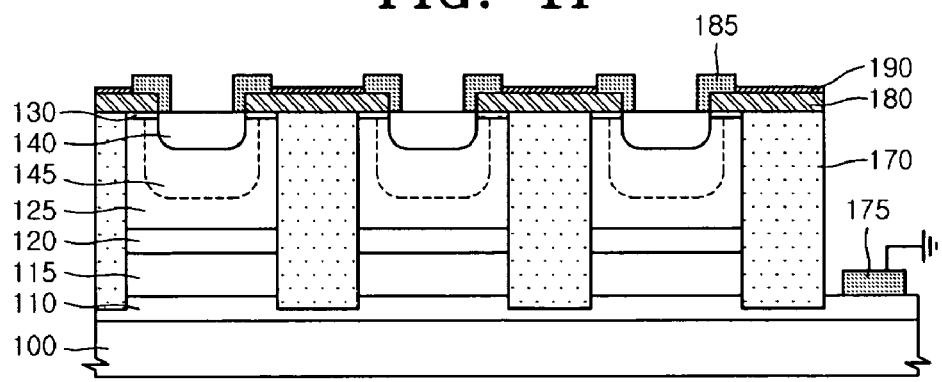

As illustrated in FIG. 1I, a metal wiring 190 for connecting the p-type electrodes 185 is formed on the insulating layer 180. Since the metal wiring 190 is formed on the planarized insulating layer 180, the metal wiring is not disconnected and the length of the metal wiring 190 is shortened, thereby reducing resistance. Since the structure of the connection line between the cells is simplified, it is possible to manufacture an array device for a two-dimensional avalanche photo-detector for detecting an image signal of a laser radar, in which the integration density, speed and noise characteristic of a photo-detector per pixel unit are high and the manufacturing efficiency thereof is improved. The ground power is applied to the n-type electrode 175, and the source voltage is applied to the p-type electrodes 185.

In the photo-detector according to an embodiment of the present invention, an isolation layer is formed, by implanting the Fe-ions, so that the p-n junction diodes, the p-type electrodes and the metal wiring are positioning on the same level. As a result, the length of the metal wiring is shortened and the arrangement of the metal wiring is simplified. Additionally, since a trench is not formed, the p-n junction side is not exposed, thereby reducing the surface leeackage current.

In a conventional photo-detector, since the p-n junction is formed on an InGaAs layer having a small band gap, a relatively large tunnelling leakage current occurs. However, in the photo-detector of the present embodiment, since the InGaAsP layer is inserted between the n-InP layer and the i-InGaAs layer, the electric field applied to an i-InGaAs layer is weakened, thereby reducing the tunnelling leakage current and improving the durability when the high bias voltage is applied for photocurrent amplification.

The present invention is not limited to the aforementioned embodiment. In the present embodiment, after the row-directional isolation region 160 is formed, the column-directional isolation region 168 is formed. However, after the column-directional isolation region 168 is formed, the row-directional isolation region 160 may be formed. But, the depth of the ion implantation in any one of the isolation regions must be controlled to be in the conductive $n^+$-InP layer 110.

As described above, according to the present invention, the isolation region for isolating the unit cells of the photo-detector array is formed by the Fe-ion implantation region. Without forming a trench, the isolation layer is formed as the implanted region so as to occupy a desired portion of the resultant structure of the substrate, thereby providing the planarized surface of the resultant structure of the substrate. Consequently, the metal wiring is arranged on the Fe ion implanted planarized surface, thereby preventing the disconnection of the metal wiring and further improving the reproducibility of wiring between cells and electrical reliability.

Furthermore, since the arrangement of the metal wiring is simplified, the spatial photo-signal distortion phenomenon decreases and attachment of the photodiode array to the driving switching circuitry of array tube is simplified to have an accurate and high speed characteristic of receiving an image signal.

Furthermore, since the p-n junction interface is not exposed, the leakage current is reduced.

Furthermore, since the InGaAsP layer is inserted to weaken the electric field applied to the photo-absorbing layer of the i-InGaAs layer 115 included in the photo-detector and to smooth the flow of the generated photocurrent, the tunnelling leakage current is reduced and the photoelectric conversion efficiency is improved. Accordingly, it is possible to manufacture a two-dimensional infrared detector array device, for detecting an image signal of an eye-safe infrared laser radar, which has the accurate and high characteristic of receiving the image signal, due to its excellent operational characteristic for high bias and its improved electrical stability.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A photo-detector comprising:
a semi-insulating compound semiconductor substrate;
a multi-layer compound semiconductor layer on the semi-insulating compound semiconductor substrate;
a number of p-n junction diodes arranged in a regular order in a selected region of the compound semiconductor layer, wherein each p-n junction diode comprises a $p^+$ diffusion region, a depletion layer and an n doped layer;
a trench isolation region in the multi-layer compound semiconductor layer individually isolating vertically the p-n junction diodes such that only the n doped layer of each p-n junction diode directly contacts the trench isolation region; and
a planarized isolation region on a portion of the compound semiconductor layer and on the trench isolation region.

2. The photo-detector of claim 1, wherein the trench isolation region is a Fe-impurity region.

3. The photo-detector of claim 1, wherein the trench isolation region comprises a row-directional trench isolation region in the multi-layer compound semiconductor layer and in the semi-insulating compound substrate; and a column-directional trench isolation region in the multi-layer compound semiconductor layer and above the semi-insulating compound substrate.

4. The photo-detector of claim 1, wherein the compound semiconductor substrate is a semi-insulating InP substrate.

5. The photo-detector of claim 4, wherein the multi-layer compound semiconductor layer is a sequentially stacked structure comprising an $n^+$-InP layer, an i-InGaAs layer, an n-InGaAsP layer, an n-InP layer, and a $p^+$-InGaAsP layer.

6. The photo-detector of claim 5, wherein the $p^+$ diffusion region of each p-n junction diode is in an upper portion in the n-InP layer and underneath the $p^+$-InGaAsP layer.

7. The photo-detector of claim 6 further comprising a n-type electrode on the $n^+$-InP layer and adjacent to the the trench isolation region; and
p-type electrodes on an edge of the $p^+$ diffusion layer of each p-n junction diode.

8. The photo-detector of claim 7, further comprising metal wiring on the p-type electrodes.

9. The photo-detector of claim 1, wherein the n doped layer of each p/n junction diode surrounds the $p^+$ diffusion region of each p-n junction diode such that the $p^+$ diffusion region of each p-n junction diode does not contact the isolation region.

10. The photo-detector of claim 1, wherein the n doped layer of each p/n junction diode surrounds the depletion layer of each p-n junction diode such that the depletion region of each p-n junction diode does not contact the isolation region.

11. The photo-detector of claim 1, wherein each p-n junction diode is an avalanche type unit cell electrically isolated from other adjacent p-n junction diodes.

12. The photo-detector of claim 1, wherein the planarized isolation region comprises a silicon nitride planarized isolation region.

* * * * *